US011259132B2

(12) United States Patent
Loeppert et al.

(10) Patent No.: US 11,259,132 B2
(45) Date of Patent: Feb. 22, 2022

(54) TRANSDUCER ASSEMBLY FAULT DETECTION

(71) Applicant: Knowles Electronics, LLC, Itasca, IL (US)

(72) Inventors: Peter V. Loeppert, Durand, IL (US); Venkataraman Chandrasekaran, Chicago, IL (US); Daryl Barry, Wilmette, IL (US); Michael Pedersen, Long Grove, IL (US); Dean Badillo, Schaumburg, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/913,799

(22) Filed: Jun. 26, 2020

(65) Prior Publication Data

US 2020/0329324 A1 Oct. 15, 2020

Related U.S. Application Data

(63) Continuation of application No. PCT/US2018/067572, filed on Dec. 26, 2018.

(60) Provisional application No. 62/610,798, filed on Dec. 27, 2017.

(51) Int. Cl.
*H04R 29/00* (2006.01)
*B81B 7/00* (2006.01)
*H04R 3/04* (2006.01)
*H04R 19/04* (2006.01)

(52) U.S. Cl.
CPC ........... *H04R 29/004* (2013.01); *B81B 7/008* (2013.01); *H04R 3/04* (2013.01); *H04R 19/04* (2013.01); *B81B 2201/0257* (2013.01); *H04R 2201/003* (2013.01)

(58) Field of Classification Search
CPC ........ H04R 29/004; H04R 3/04; H04R 19/04; H04R 2201/003; B81B 7/008; B81B 2201/0257
USPC ................ 381/56, 58, 91, 95, 111, 122, 355
See application file for complete search history.

(56) References Cited

U.S. PATENT DOCUMENTS

| 10,045,104 | B2 | 8/2018 | Qutub |
| 2013/0277776 | A1 | 10/2013 | Herzum |
| 2014/0250969 | A1* | 9/2014 | Alagarsamy .......... B81C 99/005 73/1.01 |

(Continued)

FOREIGN PATENT DOCUMENTS

DE    102015114245    3/2017

OTHER PUBLICATIONS

Jian Liu et al: "Harmonic Balance Nonlinear Identification of a Capacitive Dual-Backplate MEMS Microphone", Journal of Microelectromechanical Systems, IEEE Service Center, US, vol. 17, No. 3, Jun. 1, 2008.

*Primary Examiner* — William A Jerez Lora
(74) *Attorney, Agent, or Firm* — Loppnow & Chapa; Matthew C. Loppnow; Roland K. Bowler, II

(57) ABSTRACT

A micro-electromechanical system (MEMS) transducer assembly includes a transducer including a condenser microphone, an integrated circuit electrically connected to the transducer to receive an output voltage from the transducer, wherein the integrated circuit comprises a test signal generator configured to induce a test acoustic response in the transducer, and an evaluation circuit configured to compare the test acoustic response to a baseline acoustic response to identify a fault in the transducer.

17 Claims, 7 Drawing Sheets

(56) References Cited

U.S. PATENT DOCUMENTS

2017/0064424 A1\* 3/2017 Qutub .................... H04R 1/04
2017/0118570 A1   4/2017 Rocca
2017/0160337 A1\* 6/2017 Steele ................ H04R 29/004
2018/0234783 A1   8/2018 Clerici
2019/0170702 A1\* 6/2019 Eberl .................. G01N 29/222

\* cited by examiner

TRANSDUCER ASSEMBLY FAULT DETECTION

CROSS-REFERENCE TO RELATED APPLICATION

The present application claims priority to PCT Application No. PCT/US2018/067572, filed Dec. 26, 2018 and U.S. Provisional Patent Application No. 62/610,798, filed Dec. 27, 2017, the contents of which are incorporated herein by reference in their entirety.

TECHNICAL FIELD

The present disclosure relates generally to transducer assemblies and more particularly to fault detection in transducer assemblies, for example, in MEMS microphone assemblies, and methods therefor.

BACKGROUND

In systems including an integrated microphone, it may be difficult to determine whether a system fault is attributable to the microphone or to some other component of the system. Such systems include for example wireless communication handsets, laptop computers, and smart speakers among other devices. These and other systems may include one or more microelectromechanical systems (MEMS), electret or other microphone assemblies. A microphone may fail due to a defective component (e.g., a transducer), defective assembly, an obstructed sound port, or transducer contamination, among a variety of other reasons. Conventional techniques for verifying that the microphone is not faulty require at least partial disassembly of the system, resulting in possible damage to the microphone or to other system components.

SUMMARY

Various embodiments disclosed herein are related to a transducer assembly. In some embodiments, the transducer assembly includes a housing including a sound port. In some embodiments, the transducer assembly includes a microelectromechanical system (MEMS) transducer disposed in the housing. In some embodiments, the transducer assembly includes an electrical circuit disposed in the housing. In some embodiments, the electrical circuit is electrically connected to an output of the MEMS transducer. In some embodiments, the electrical circuit includes a signal generator configured to generate and apply a test signal to the MEMS transducer. In some embodiments, the test signal induces a response from the transducer assembly indicative of health of the transducer assembly.

In some embodiments, the housing includes a cover disposed on a substrate having an external-device interface with a plurality of contacts coupled to the electrical circuit.

In some embodiments, the signal generator includes a resistor, wherein the signal generator is configured to generate a thermo-acoustic test signal within the housing by applying power to the resistor.

In some embodiments, the signal generator includes an electrical output coupled to an electrical input of the MEMS transducer, wherein the signal generator is configured to apply an electrical test signal having a known characteristic to the electrical input of the MEMS transducer.

In some embodiments, the MEMS transducer includes a back plate and a diaphragm, and the electrical circuit includes a bias circuit having a bias output coupled to a bias input of the MEMS transducer. In some embodiments, the signal generator is configured to apply the electrical test signal to the MEMS transducer via the bias input of the MEMS transducer. In some embodiments, the electrical test signal has a frequency within a bandwidth of the transducer assembly.

In some embodiments, the electrical test signal is a single frequency AC signal.

In some embodiments, the signal generator is configured to generate and apply different test signals to the MEMS transducer.

In some embodiments, the different test signals comprise AC signals having different frequencies.

In some embodiments, the electrical circuit includes an amplifier configured to receive an output signal from the MEMS transducer and generate an amplified signal having an output voltage. In some embodiments, the electrical circuit includes a test load disposed between the MEMS transducer and the amplifier. In some embodiments, the electrical circuit includes a switching device configured to connect the test load with the MEMS transducer and the amplifier in a closed state and disconnect the test load from the MEMS transducer and the amplifier in an open state. In some embodiments, a fault is isolated by monitoring the response of the MEMS transducer when the test load is connected and disconnected.

In some embodiments, the signal generator is configured to generate and apply an electrical test signal in an impulse signal adapted to induce an impulse acoustic response from the transducer assembly.

Various embodiments disclosed herein are related to a transducer assembly. In some embodiments, the transducer assembly includes a housing, a micro-electromechanical system (MEMS) transducer disposed in the housing, and an integrated circuit disposed in the housing and electrically connected to an electrical signal output of the MEMS transducer. In some embodiments, the integrated circuit includes a test signal generator having an output coupled to the MEMS transducer, where the test signal generator is configured to generate and apply a test signal to the MEMS transducer. In some embodiments, the integrated circuit includes an evaluation circuit coupled to the output of the transducer assembly, where the evaluation circuit is configured to compare a response of the transducer assembly induced by the test signal to reference information, whereby results of the comparison are indicative of a possible fault of the transducer assembly.

In some embodiments, the integrated circuit includes a bias circuit having an output coupled to a bias input of the MEMS transducer, where the output of the test signal generator is coupled to the bias input of the MEMS transducer. In some embodiments, the test signal generator is configured to generate and apply an electrical test signal to the MEMS transducer, wherein the electrical test signal is superimposed onto an electrical bias applied to the MEMS transducer. In some embodiments, the integrated circuit includes an amplifier configured to receive an output signal from the MEMS transducer and generate an amplified signal having an output voltage. In some embodiments, the integrated circuit includes a test load disposed between the MEMS transducer and the amplifier. In some embodiments, the integrated circuit includes a switching device configured to connect the test load with the MEMS transducer and the amplifier in a closed state and disconnect the test load from the MEMS transducer and the amplifier in an open state. In some embodiments, a fault is isolated by monitoring the response of the MEMS transducer when the test load is connected and disconnected.

In some embodiments, the test signal generator is configured to generate and apply an AC electrical signal having either a single or a variable frequency to the MEMS transducer.

In some embodiments, the evaluation circuit is electrically connected to the output of the test signal generator, wherein the evaluation circuit is configured to compare the electrical test signal to the output signal of the transducer assembly to identify a fault.

In some embodiments, the test signal generator is configured to generate and apply an impulse signal to the MEMS transducer.

In some embodiments, the integrated circuit includes a load resistor electrically connected to the test signal generator, wherein the test signal is a thermo-acoustic signal produced by the load resistor in response to power applied by the test signal generator.

Various embodiments disclosed herein are related to a method for fault detection in a transducer assembly having a transducer and an integrated circuit deposed within a housing having a port. In some embodiments, the method includes inducing a response from the transducer assembly by applying a test signal to a transducer of the transducer assembly, where the test signal has a known characteristic. In some embodiments, the method includes comparing the response of the transducer assembly to reference information. In some embodiments, a result of the comparison is indicative of whether or not there is a fault with the transducer assembly.

In some embodiments, applying the test signal to the transducer of the transducer assembly includes applying an electrical test signal to a bias input to the transducer, wherein the electrical test signal is superimposed with a bias signal.

In some embodiments, the method further includes inducing a plurality of responses from the transducer assembly by applying a test signal to a transducer over time, where each response is separated by a time interval. In some embodiments, the method includes storing the plurality of responses, wherein the plurality of responses is compared to reference information to determine whether the transducer assembly has a fault.

In some embodiments, applying the test signal to the transducer of the transducer assembly includes applying a thermo-acoustic test signal to the transducer, wherein the thermo-acoustic test signal is applied within the housing.

Various embodiments disclosed here are related to a transducer assembly. In some embodiments, the transducer assembly includes housing including a port, where the housing includes a cover disposed on a substrate having an external-device interface. In some embodiments, the transducer assembly includes a transducer disposed in the housing. In some embodiments, the transducer assembly includes an electrical circuit disposed in the housing, where the electrical circuit is electrically connected to an output of the transducer. In some embodiments, the transducer assembly further includes a plurality of contacts disposed on the external-device interface. In some embodiments, the plurality of contacts are electrically coupled to the electrical circuit, where one of the plurality of contacts is an output signal contact, and another of the plurality of contacts is a test signal input contact electrically coupled to the transducer. In some embodiments, application of a test signal to the test signal input contact induces a response from the transducer assembly that is output on the output signal contact.

In some embodiments, the transducer assembly is devoid of a test signal generator.

In some embodiments, the transducer is a micro-electromechanical system (MEMS) transducer.

In some embodiments, the electrical circuit includes a bias circuit, wherein the bias circuit is electrically connected to a bias input of the transducer, wherein the bias circuit supplies a bias voltage to the transducer, and wherein the test signal input contact is electrically connected to the bias input.

In some embodiments, the electrical circuit includes a load resistor configured to generate a thermo-acoustic signal that induces the response, wherein the test signal input contact is electrically connected to the load resistor.

In some embodiments, the electrical circuit includes an evaluation circuit electrically connected to the output of the transducer, where the evaluation circuit is configured to generate an error signal based on the response from the transducer assembly.

In some embodiments, the evaluation circuit is electrically connected to the test signal input contact, wherein the evaluation circuit comprises a comparator that compares the response from the transducer assembly to the test signal.

DETAILED DESCRIPTION

Figure 1:
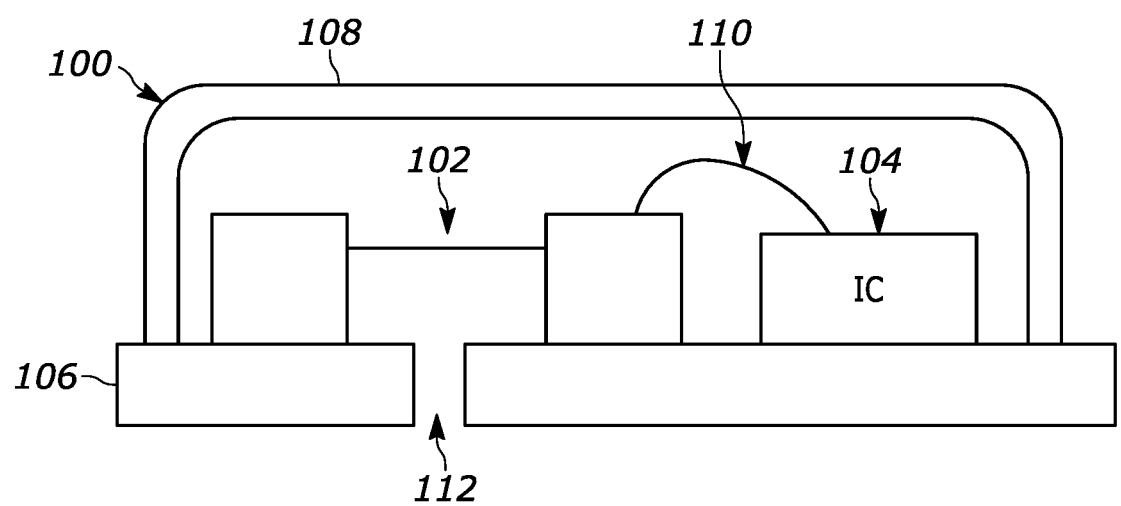
FIG. 1 is a cross-sectional view of a microelectromechanical systems (MEMS) transducer assembly.

The figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, the applicant does not intend for any term in the specification or claims to be ascribed an uncommon or special meaning unless explicitly set forth as such. Further, the present embodiments encompass present and future known equivalents to the known components referred to herein by way of illustration.

The disclosure relates to a transducer assembly including a transducer and an electrical circuit and fault detection mechanisms therefor. In some embodiments, the transducer assembly has a built-in self-test mechanism including a signal generator configured to generate and apply a test signal that induces a response from the transducer assembly. Alternatively, the test signal may be generated and applied to the transducer by a device external to the transducer assembly. The response induced by the test signal may be assessed relative to reference or baseline information to determine a condition or health of the transducer assembly. The transducer assembly may be configured as a microphone to detect sound within the human audible frequency range alone or in combination with frequencies below or above (e.g., ultrasonic frequencies) the human audible range. In other embodiments, the transducer assembly is configured as a sensor that primarily detects frequencies outside the human audible frequency range.

In another embodiment, the transducer assembly includes a transducer and an electrical circuit disposed in a housing including a port and an external-device interface. A plurality of electrical contacts are disposed on the external-device interface and electrically coupled to the electrical circuit. At least one of the contacts is an output signal contact that provides an output signal based on an electrical signal produced by the transducer, and another of the contacts is a test signal input contact electrically coupled to the transducer. The application of a test signal to the test signal input contact (e.g., by a host device) induces a response from the transducer assembly that is output on the output signal contact, wherein the health of the transducer assembly may be assessed based on the induced output signal. In this embodiment, the transducer assembly is devoid of a test signal generator. The test signal input contact may be re-purposed upon configuration of the transducer assembly in a test mode, thus eliminating the need for a dedicated test signal input contact.

The test signal may take various forms. In some embodiments, the test signal comprises an electrical signal applied to an electrode of the transducer. In transducers requiring an electrical bias, the electrical signal may be superimposed on the applied bias. Alternatively, the electrical test signal may be applied to some other input of the transducer.

Different types of electrical test signals or combinations of different test signals may be used to detect different faults, examples of which are described further herein. In one embodiment, the electrical test signal is an AC signal having a frequency within a bandwidth of the transducer. In another embodiment, the electrical test signal has a time-variant frequency that induces a frequency-based response from the transducer assembly. In another embodiment, the electrical test signal is an electrical impulse or step signal that induces an impulse or step response, respectively.

In other embodiments, the test signal is a thermo-acoustic signal generated proximate to the transducer, for example, in a housing of the assembly. Such a signal may be generated by applying an AC electrical signal to a resistive element. Heat generated by the resistive element causes a pressure change that is detectable by the transducer. Such a thermo-acoustic signal induces a response from the transducer, which may be indicative of the health of the assembly. The generation and application of these and other test signals are discussed herein.

One or more faults of the transducer assembly may be detected by comparing the response induced by the test signal to reference or baseline information. As described herein, the phrase "reference or baseline information" refers to data that can be compared to the response induced by the test signal. For example, the manufacturer may provide such data by measuring the transducer assembly (or another comparable device) when the transducer assembly is deemed to be functioning properly. Deviations in the response from the reference or baseline information may be indicative of the health.

In some instances, it may be possible to identify a particular fault with the transducer assembly, e.g., an obstructed port, a contaminated transducer, faulty circuit, etc. For example, a diminution in response to an impulse signal may indicate an obstruction of an acoustic port. Reduced magnitude of an induced response may indicate loss of sensitivity. A change in a frequency response may be detected by applying a variable or swept frequency signal to the transducer. These and other aspects of fault detection are discussed herein. Beneficially, the systems, methods, and apparatuses described herein eliminate the need to perform invasive testing procedures to assess the health of the transducer assembly.

Comparison of the test signal response to the reference or baseline information may be performed at the transducer assembly or at some other device. In some implementations, for example, the transducer assembly includes a processor programmed via a testing application to compare response with predetermined (e.g., baseline or reference) criteria stored on the transducer assembly during manufacture. The absence of a fault indication enables the user to exclude the transducer assembly as a source of a system fault or error. Alternatively, the response may be ported to another device for assessment or analysis. The transducer assembly may also be configured to store responses to test signals applied over time thereby tracking its health. The stored data may be interrogated at a later time. Thus the health of the transducer may be tested and monitored without disassembly.

FIG. 1 is a cross sectional view of a transducer assembly 100, according to an example embodiment, including a transducer 102 and an electrical circuit 104 that may be implemented as an application-specific integrated circuit ("ASIC") disposed in a housing formed by a substrate 106 and a cover 108. The transducer 102 is coupled to the electrical circuit 104 by one or more electrical leads 110, depending on the transducer type. The electrical circuit 104 receives an electrical signal from the transducer and may amplify and condition the signal before outputting a digital or analog acoustic signal as is known generally. The electrical circuit 104 may also include a protocol interface, not shown, depending on the output protocol desired. The transducer assembly 100 may also be configured to permit programming or interrogation thereof as described herein. Exemplary protocols include but are not limited to PDM, PCM, SoundWire, I2C, I2S and SPI, among others.

In FIG. 1, the transducer 102 and the electrical circuit 104 are shown disposed on a surface of the substrate 106, but in other embodiments one or more of these components may be disposed on the cover or sidewalls or stacked atop one another. The housing includes a port 112 through which acoustic energy may enter the housing. In other embodiments, the port can be located on the sidewall or cover. In some embodiments, the substrate includes an external-device interface having a plurality of contacts coupled to the electrical circuit, for example to the protocol interface thereof. The contacts may be embodied as pins, pads, bumps or balls among other known or future mounting structures. The functions and number of contacts on the external-device interface depend on the protocol or protocols implemented and may include power, ground, data, and clock contacts among others. The external-device interface permits integration of the transducer assembly with a host device using reflow-soldering or other assembly processes.

In one implementation, the transducer 102 is a microelectromechanical systems (MEMS) transducer embodied as a condenser-type transducer having a diaphragm movable relative to a back plate in response to changes in acoustic pressure. Alternatively, the MEMS transducer 102 is a piezoelectric device, or some other known or future electroacoustic transduction device implemented using MEMS technology. In still other implementations, the transducer 102 is a non-MEMS device embodied, for example, as an electret or other known or future non-MEMS type transduction device. These and other electro-acoustic transduction devices are known generally and are not described further except to the extent necessary to make and use the embodiments disclosed herein.

Figure 2:
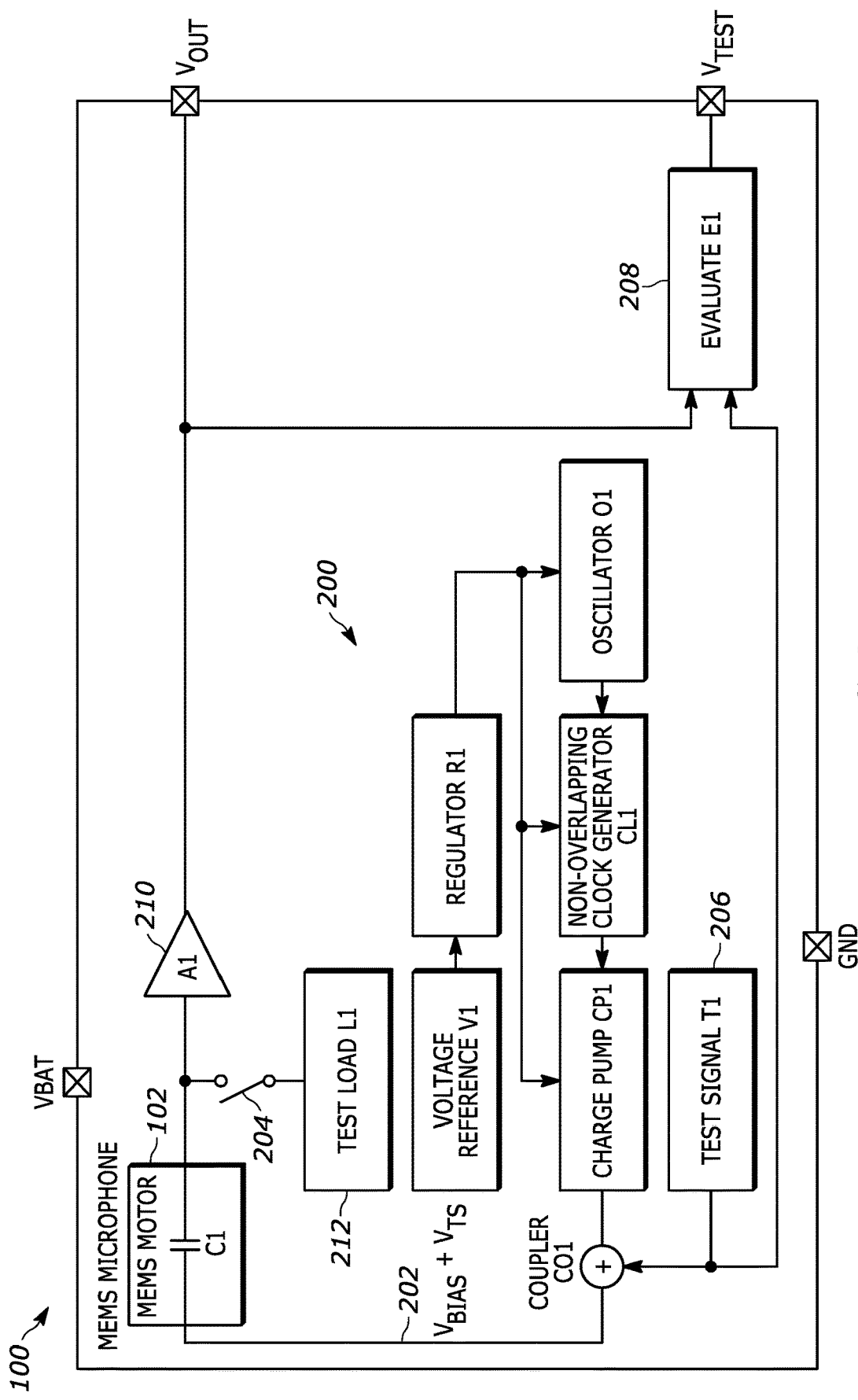
FIG. 2 is a schematic diagram of a transducer assembly including a built-in test signal generator.

In embodiments where the transducer requires an electrical bias, the electrical circuit 104 includes a bias circuit having an output coupled to a bias input of the transducer as shown in FIG. 2. Such transducers include but are not limited to condenser-type devices wherein the magnitude of the electrical bias depends on the design of the particular device. For example, a constrained diaphragm condenser-type transducer may require an electrical bias on the order of only one volt whereas a condenser-type transducer having a free-plate diaphragm may require a bias on the order of 10 volts. Other transducer types may also require an electrical bias. In some embodiments the bias circuit is implemented as a charge pump. Charge pumps are known generally and not discussed further herein. In other implementations the transducer assembly includes a transducer that does not require an electrical bias and thus the electrical circuit does not require a bias circuit. Piezoelectric and other transducers may not require an electrical bias.

In the example shown, the electrical circuit 104 is embodied as an ASIC and includes a bias circuit that applies a bias voltage to the first and second electrodes via electrical leads 110. The electrical circuit 104 may include an amplifier, filter, buffer among other components or combination thereof between the input and output. Digital transducer assemblies typically include an analog-to-digital converter and may also include an interface protocol circuit among other components. Some transducer assemblies include a processor for performing signal processing, examples of which are described herein.

In FIG. 2, a schematic diagram of various components of the transducer 100 is shown, according to an example embodiment. In various embodiments, with exception of the transducer 102, the components of the electrical circuit described with respect to FIG. 2 may be implemented on one or more integrated circuits illustrated schematically as electrical circuit 104.

In FIG. 2, the electrical circuit 104 includes biasing circuitry 200 including a voltage reference (e.g., a battery) and voltage regulator configured to provide power for an oscillator, clock generator, charge pump, and other circuit components. The charge pump generates a bias voltage $V_{bias}$ supplied to the transducer via a conductor 202 for charging the electrodes of the transducer 102 as is known generally.

In FIG. 2, transducer assembly 100 further includes a test signal generator 206 configured to generate an electrical test signal adapted to induce a response from the transducer assembly. An output of the test signal generator 206 is connected to the conductor 202 via a coupler. As such, the test signal is superimposed onto $V_{bias}$ at the conductor 202. However, it should be appreciated that the test signal may be provided to other electrical inputs of the transducer 102 in other embodiments. Alternatively, the test signal may be generated and provided to the transducer by a signal generator that is external to the transducer assembly. Such an external signal generator may be coupled to the transducer assembly by the external-device interface. For example, in some implementations, external test signals could be injected into an ASIC through designated test pads.

The test signal generator 206 may take different forms depending on the implementation. For example, in some embodiments, the test signal generator 206 is an oscillator generating a single-frequency AC signal. In such embodiments, the frequency of the generated AC signal may be selected based on the configuration of the transducer 102 (e.g., the size of the back plate and diaphragm, magnitude of the front and back volumes, etc.). In another embodiment, the test signal generator 206 is configured to generate and apply a variable frequency test signal to the transducer to test a frequency response of the transducer assembly. The variable frequency test signal may be generated by a processor, e.g., a DSP, disposed in the housing or it may be applied to the transducer by an external device via the external-device interface of the transducer assembly in a test mode.

In some embodiments, the test signal generator 206 comprises a waveform generator configured to generate any one of a number of different test signals depending on a configuration of the transducer assembly or on external inputs received from a host system. For example, in some embodiments, the test signal generator 206 includes an internal memory having a plurality of waveform parameters stored therein, and is configured or programmed to generate and apply one or more different waveforms to the transducer when the transducer is in a test mode. The transducer assembly may be configured in the test mode upon powering ON, or upon receipt of a test mode command via the external-device interface from a host device, etc. For example, the host device may include a software program enabling testing upon request. Alternatively or additionally, the transducer assembly is automatically placed in test mode upon the transducer being powered ON. In another embodiment, the transducer assembly is periodically placed into test mode. In an example, the test signal generator may be configured to generate and apply an impulse signal or a step signal to the transducer to induce an impulse response or a step response. Some test signals may be better suited to detect different types of faults. Thus in some embodiments, a battery of different test signals is sequentially applied to the transducer 102. Generally, one or more test signals may be applied at startup or at arbitrary times when a test mode is otherwise invoked. For example, in some embodiments, upon powering ON the transducer assembly, the test signal generator 206 may be pre-programmed to first apply an impulse signal to the transducer, and subsequently apply a continuous AC signal at a predetermined frequency, then apply a signal with a swept frequency, etc. In other embodiments, other signals may also be applied in the sequence. This way, a response to different test signals may be obtained at start-up. Such information may be stored for later interrogation as described above.

In some embodiments, the electrical circuit 104 includes an evaluation circuit 208 shown in FIG. 2. The test signal generated via the test signal generator 206 is also provided to the evaluation circuit 208. The evaluation circuit 208 is configured to generate an error signal Vtest based on a comparison between the test signal received from the test signal generator 206 and the output signal $V_{out}$ generated in response to the test signal. The error signal Vtest is based on a difference between the test signal and the output signal $V_{out}$. The evaluation circuit 208 may be implemented as a comparator or some other circuit that evaluates the induced signal. A deviation of the output voltage $V_{out}$ from the test signal above some threshold may be indicative of a fault in the transducer assembly.

In some embodiments, the evaluation circuit 208 is embodied as a processor configured to assess characteristics of the output (e.g., amplitude, frequency response, impulse response, etc.) in response to test signals applied to the transducer over time.

In FIG. 2, the transducer 102 is electrically connected to an amplifier 210 configured to amplify the voltage output. In one embodiment, a test load 212 is disposed between the transducer 102 and the amplifier 210. The test load 212 is selectively coupled to the transducer 102 via a switching element 204 to change the load on the transducer. For example, in one embodiment, switching element 204 includes a transistor configured to couple the test load 212 to the transducer 102 when the transducer assembly 100 is in a test mode (e.g., upon powering ON, upon a host device providing a test mode command via the external-device interface, etc.).

The test load 212 can be used to help determine whether there are contaminants present within the transducer 102. When connected to the transducer 102, the test load 212 and transducer 102 form a voltage divider with the output voltage $V_{out}$ as an output. As such, changes in impedance of transducer 102 will induce changes in the measured output voltage $V_{out}$ when a test signal is applied to the transducer 102. Thus, in various embodiments, the load 212 may include any suitable electrical component having an impedance (e.g., capacitance) comparable to a baseline impedance of the transducer 102. The output voltage $V_{out}$ may be measured after a test signal is applied to the transducer 102 at various points in time to detect impedance changes. Such impedance changes may be indicative of certain contaminants being lodged in the transducer 102 impairing its operation. In some embodiments, the evaluation circuit 208 may monitor the output voltage $V_{out}$ and detect changes in sensitivity in response to switching the test load 212 into and/or out of circuit with the switching element 204. The evaluation circuit 208 may determine whether to raise a fault indicating the transducer 102 is likely contaminated based on a response of the sensitivity of the transducer 102 to the test load 212. In some implementations, external circuitry could be used to detect the likely presence of contaminants and/or raise a fault instead of evaluation circuit 208.

For example, assume the microphone 100 shown in FIG. 2 has low sensitivity. It would not necessarily be clear whether the low sensitivity is caused by the amplifier 210 or the transducer 102. For example, the amplifier 210 could have low gain due to an electrostatic discharge event or other problem, the transducer 102 could be contaminated, the voltage of the charge pump could be low, etc. If the test load 212 is connected and the sensitivity drops below a level expected upon connection of the test load 212, this would indicate that the problem is most likely with the transducer 102, as there would now be a capacitive voltage divider consisting of the transducer 102 and the test load 212 (which may be a capacitor). The gain of the amplifier 210 would not be affected by connecting the test load 212. Thus, the evaluation circuit 208 may monitor $V_{out}$ and detect changes in sensitivity of the transducer 102. In some implementations, the evaluation circuit 208 may be programmed with a reference sensitivity level, which may be a sensitivity level at which the transducer 102 would normally operate in the absence of contaminants. In the event the sensitivity drops in response to connection of the test load 212 to less than the reference sensitivity level (e.g., if the sensitivity is less than the reference sensitivity level by at least a threshold amount, such as five percent, ten percent, etc.), the evaluation circuit 208 may raise a fault raised indicating that the transducer 102 is likely contaminated. In some implementations, the capacitance of the transducer 102 may be measurable if the capacitance of the test load 212 is known (e.g., if the test load 212 is a trimmed capacitor).

Figure 3:
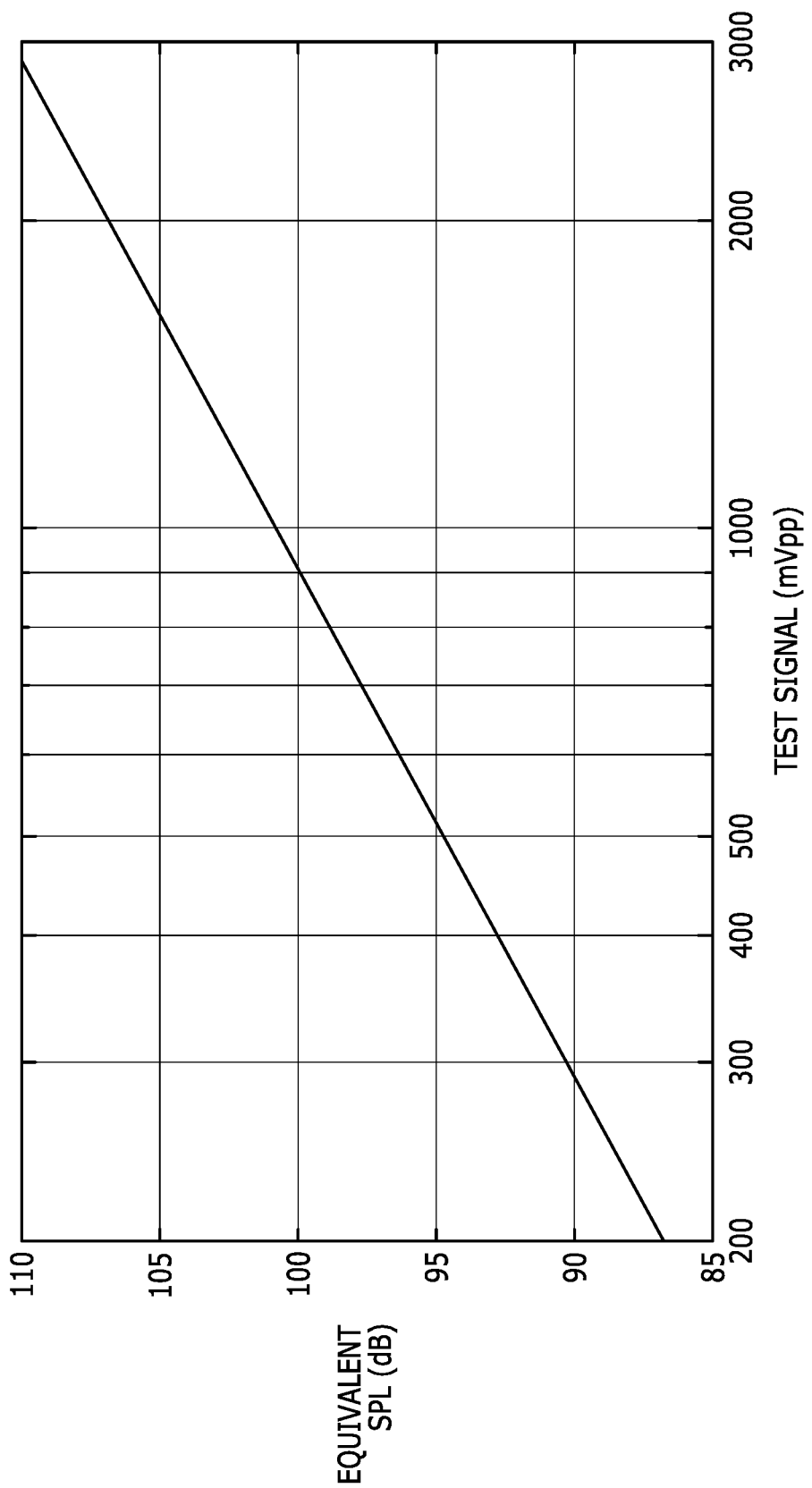
FIG. 3 is a chart of equivalent acoustic sound pressure level (SPL) as a function of test signal amplitude.

The test signal generator 206 produces and applies a consistent electrical test signal to the transducer 102. The accuracy of fault detection is improved by measuring the response of transducer assembly to consistent stimuli. One measurable aspect of the response to a test signal is sensitivity. FIG. 3 shows a plot of equivalent acoustic SPL (e.g., an average sound pressure level over a period of time) against input signal amplitude. The input signal may comprise an AC signal having a frequency within the bandwidth of the transducer. Thus, diminution in sensitivity to the test signal generated via test signal generator 206 is indicative of various faults (e.g., faulty connections, obstructed port, etc.).

In some embodiments, test signal generator 206 is configured to apply a continuous, single-frequency signal to transducer 102 each time the device is powered ON. Changes in the output voltage in response to the test signal may be measured to identify changes in sensitivity. If the sensitivity changes by more than a threshold amount, for example, a fault indication may be provided.

Figure 4:
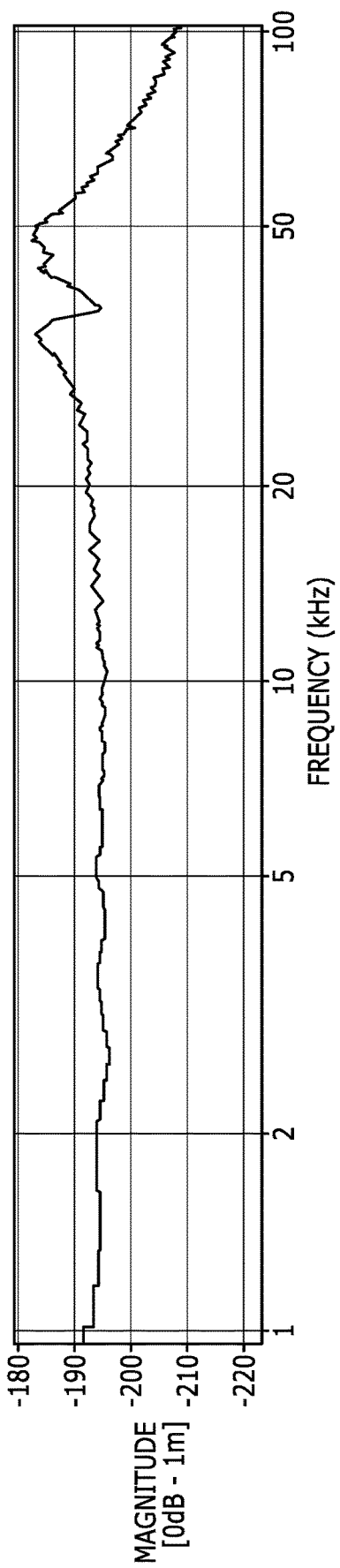
FIG. 4 is a chart of a transducer assembly response as a function of test signal frequency.

FIG. 4 shows a chart illustrating a frequency response of a transducer assembly to and AC test signal having a variable or swept frequency. The signals may share an amplitude but have different frequencies to facilitate measurement of the frequency response of the transducer. As shown, the frequency response includes a first peak at approximately 35 kHz and a second peak at approximately 48 kHz. The locations of such peaks are dependent on various aspects of the transducer assembly (e.g., transducer type, transducer size, geometries port location, etc.). Additionally, deviations in the locations of such peaks from baseline values may indicate one or more faults (e.g., debris within a volume, a poor connection, etc.). Accordingly, in some embodiments, a test signal may be swept across various frequencies to measure the transducer's frequency response to identify locations (e.g., peaks, local maxima, local minima, etc.) of features therein. Deviations of the features of the frequency response relative to baseline features may be indicative of a fault notification.

Figure 5:
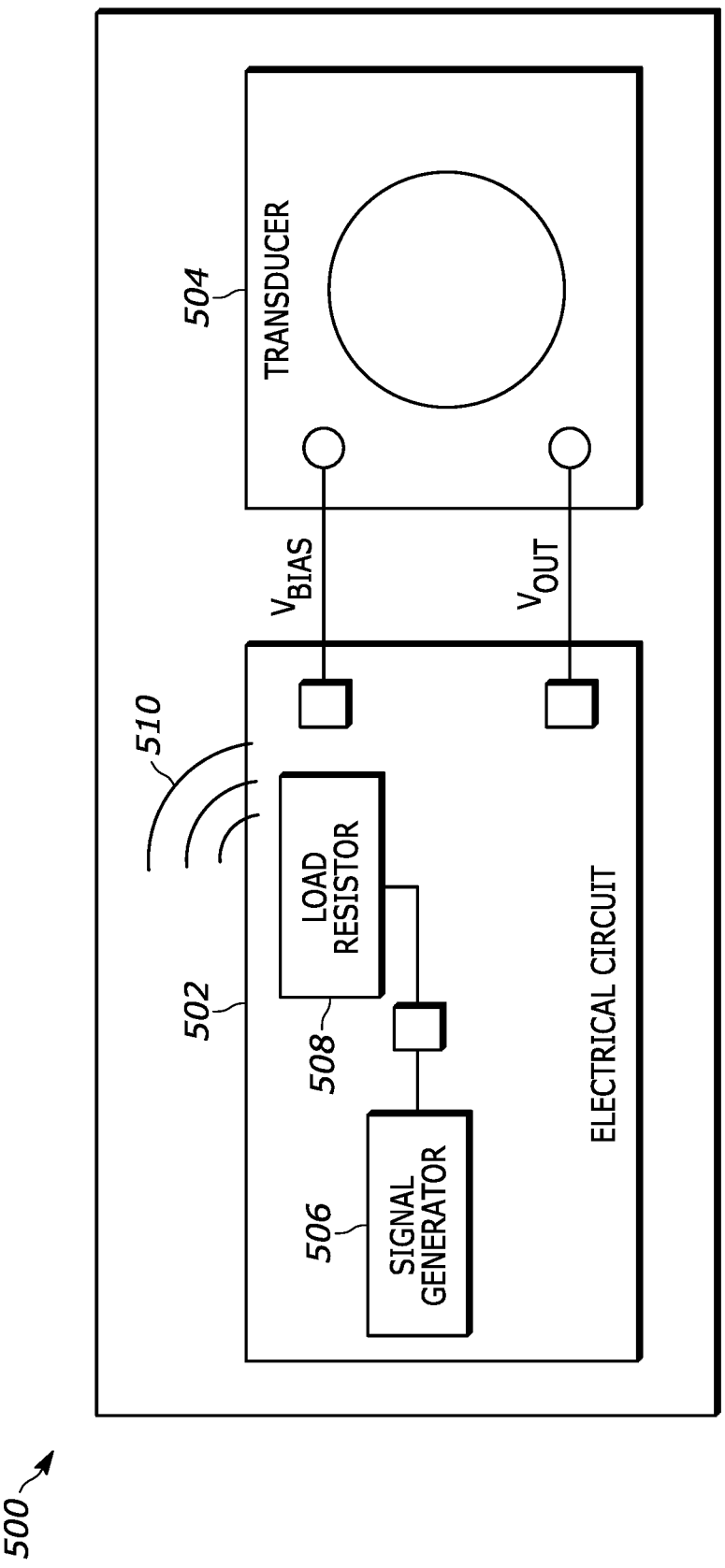
FIG. 5 is a block diagram of a transducer assembly including a signal generator with a signal load.

In FIG. 5, a block diagram of another transducer assembly 500 is shown including an electrical circuit 502 (e.g., an ASIC) and a transducer 504. Electrical circuit 502 may include various components (e.g., a power supply, a charge pump, etc.) described with respect to FIG. 2. As shown, a bias voltage $V_{bias}$ is provided to a lead on transducer 504 to pre-charge transducer 504 to enable measurement of capacitance variations responsive to acoustic signals, but the bias may not be required for some types of transducers.

The transducer assembly 500 differs from those described with respect to FIGS. 1-4 in that the test signal is not an electrical signal. Instead, in FIG. 5, the test signal is a thermo-acoustic signal generated via application of power to a load resistor 508 disposed proximate to the transducer within the housing. The electrical signal is generated via a signal generator 506 (e.g., an oscillator producing an AC signal at a predetermined or an adjustable frequency). The AC signal may also have an adjustable amplitude.

Figure 6:
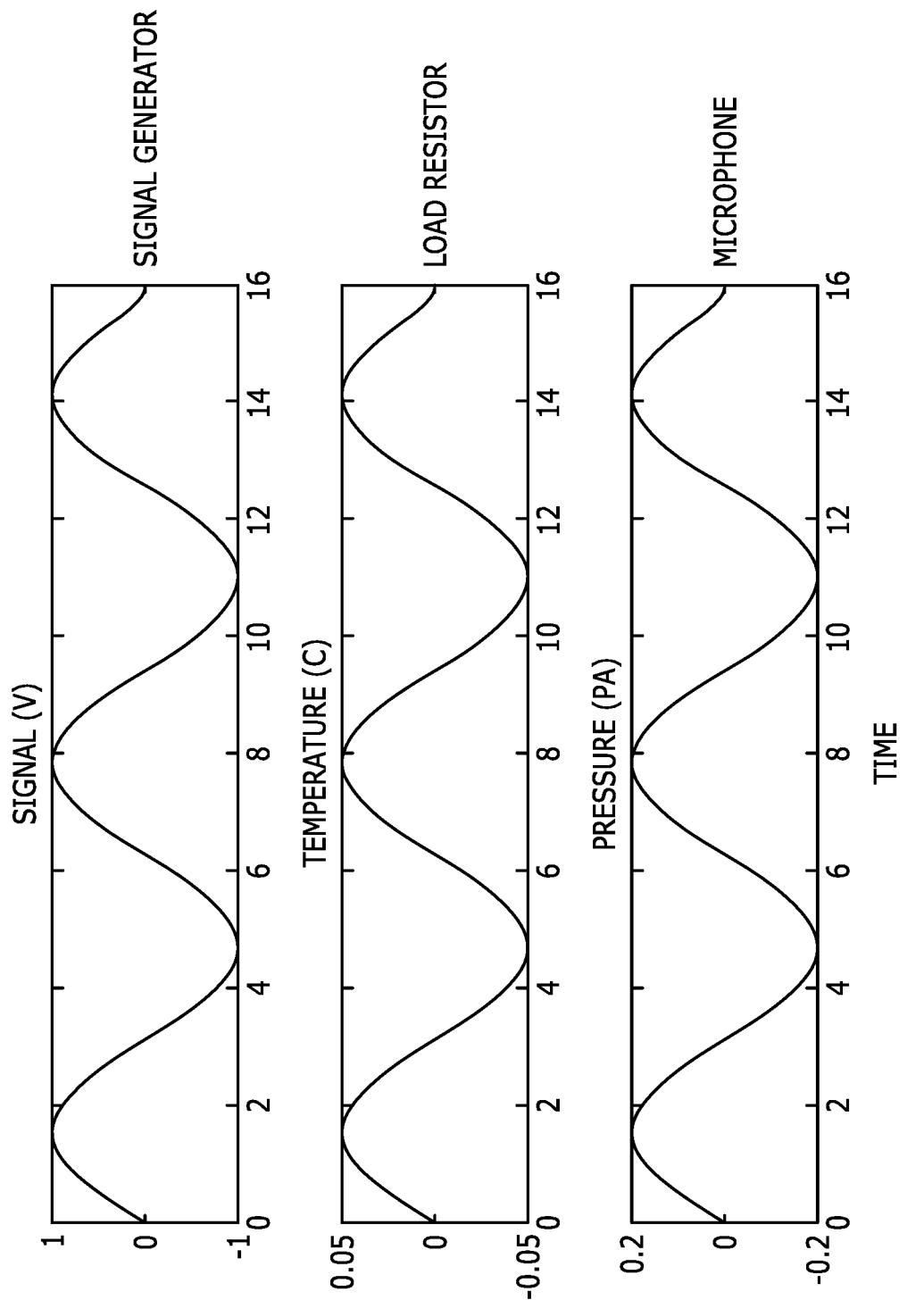
FIG. 6 is a chart illustrating an acoustic response of a transducer assembly to an acoustic signal.

Application of power to the load resistor 508 induces a consistent thermo-acoustic signal 510 proximate to the transducer 504. As such, assuming a properly functioning transducer assembly, the measured response $V_{out}$ should remain consistent and be similar to other properly functioning devices. Thus, variations in the measured response to the acoustic signal 510 may be indicative of a defect. FIG. 6 illustrates an example acoustic response of transducer assembly 500. As shown, providing the alternating current to the load resistor 508 induces thermal fluctuations (e.g., illustrated temperature fluctuations). In FIG. 6, thermal fluctuations result in corresponding pressure fluctuations that induce a response from the transducer assembly. The thermo-acoustic signal thus induces a measurable response in the transducer assembly. The response, for example, serves as a comparative baseline for comparison against later measurements for fault identification.

In some embodiments, the transducer assembly includes a combination of the self-test mechanisms described with respect to FIGS. 2 and 5. In such embodiments, the transducer assembly may perform any combination of the self-tests described herein to assess the health or exclude it as a source of a system fault.

Figure 7:
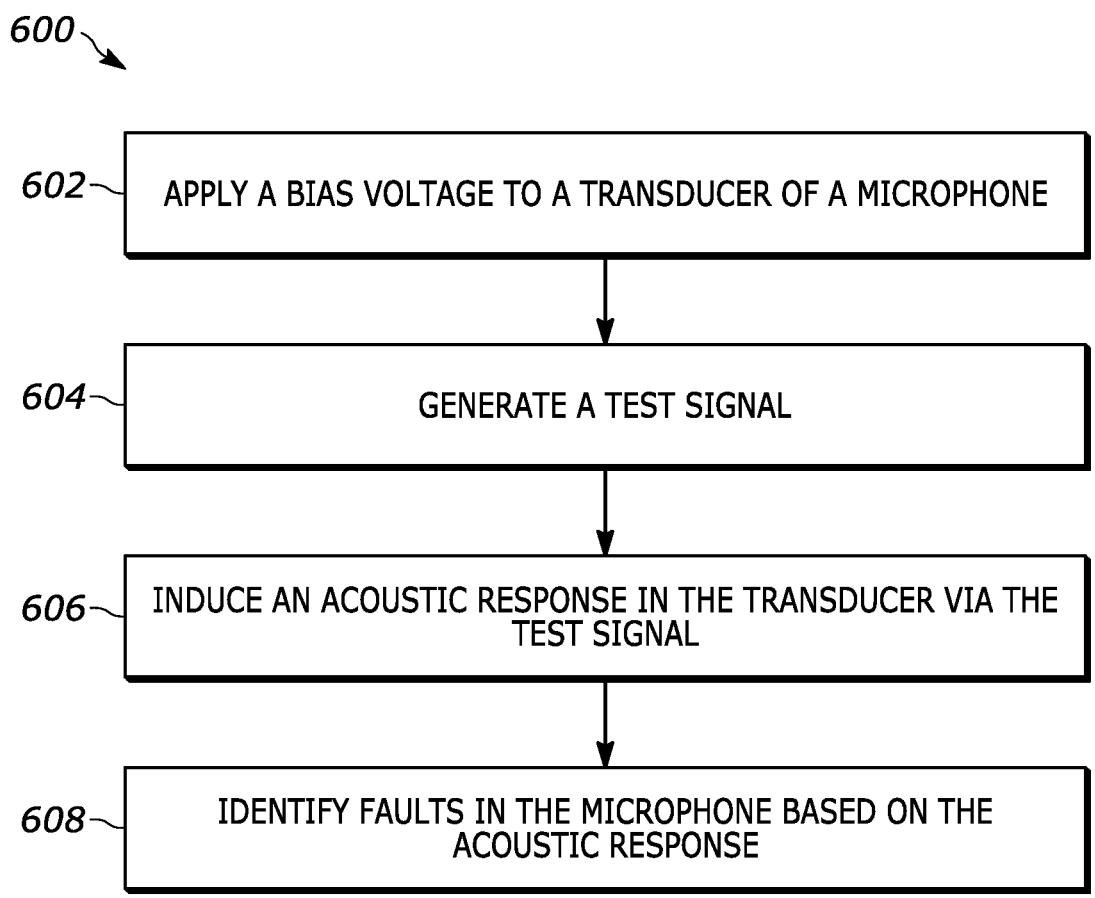
FIG. 7 is a flow diagram of a method of detecting a fault in a transducer assembly.

Referring now to FIG. 7, a flow diagram of a method 600 of identifying faults in a transducer assembly is shown, according to an example embodiment. The operations of the method 600 may be performed via circuitry that is part of the transducer assembly or the operations described herein may be performed via a host device in communication with the transducer assembly.

In embodiments that include a transducer that requires a bias, at operation 602, the bias is applied to a transducer. For example, the transducer assembly may include bias circuitry including a voltage regulator and charge pump configured to generate the bias voltage. In operation 604, a test signal is generated. The test signal may be embodied as an electrical signal applied to the transducer or as a thermo-acoustic signal emitting in a housing of the transducer assembly as discussed more fully herein.

In operation 606, the test signal is applied to the transducer assembly to induce a response therefrom. The mechanism by which the test signal is applied to the transducer depends on whether the test signal is an electrical signal or a thermo-acoustic signal as discussed more fully herein. In operation 608, a determination of the transducer assembly health is made based on a response induced by the test signal. As discussed herein, the induced response may be compared or otherwise assessed to baseline or reference information. Such assessment may be performed by the transducer assembly or alternatively the induced response may be ported to a host or other device for assessment. A transducer assembly and test mechanisms therefor are described herein. It should be understood that the illustrated embodiments are exemplary only, and should not be taken as limiting the scope of the appended claims.

What is claimed is:

1. A transducer assembly comprising:
   a housing including a sound port;
   a micro-electromechanical system (MEMS) transducer disposed in the housing; and
   an electrical circuit disposed in the housing, the electrical circuit electrically connected to an output of the MEMS transducer, the electrical circuit including a signal generator configured to generate and apply a test signal to the MEMS transducer, the signal generator including a resistor, wherein the signal generator is configured to generate a thermo-acoustic test signal within the housing by applying power to the resistor,
   wherein the test signal induces a response from the transducer assembly indicative of health of the transducer assembly.

2. The transducer assembly of claim 1, wherein the housing comprises a cover disposed on a substrate having an external-device interface with a plurality of contacts coupled to the electrical circuit.

3. An integrated circuit for integration with a transducer assembly comprising a micro-electromechanical system (MEMS) transducer disposed in a housing, the integrated circuit comprising:
   an input electrically connectable to an electrical signal output of the MEMS transducer;
   a test signal generator having an output connectable to the MEMS transducer, the test signal generator configured to generate and apply a test signal swept across various frequencies to the MEMS transducer to measure the MEMS transducer's frequency response; and
   an evaluation circuit coupled to the output of the transducer assembly, the evaluation circuit configured to compare a response of the transducer assembly induced by the test signal to reference information, whereby results of the comparison are indicative of a possible fault of the transducer assembly.

4. The integrated circuit of claim 3, further comprising:
   a bias circuit having an output connectable to a bias input of the MEMS transducer, the output of the test signal generator coupled to the bias circuit, the test signal generator configured to generate an electrical test signal superimposed onto an electrical bias generated by the bias circuit;
   an amplifier connectable to an output of the MEMS transducer and configured to generate an amplified signal having an output voltage;
   a test load coupled to the amplifier; and
   a switching device configured to connect the test load to the MEMS transducer in a closed state and to disconnect the test load from the MEMS transducer in an open state,
   wherein a fault is isolated by monitoring a response of the MEMS transducer when the test load is connected and disconnected to the MEMS transducer.

5. The integrated circuit of claim 4, wherein the test signal generator is configured to generate and apply an AC electrical signal having either a single or a variable frequency at an output connectable to the MEMS transducer.

6. The integrated circuit of claim 4, the evaluation circuit electrically connected to the output of the test signal generator, wherein the evaluation circuit is configured to compare the electrical test signal to the output signal of the transducer assembly to identify a fault.

7. The integrated circuit of claim 3, wherein the test signal generator is configured to generate and apply an impulse signal at an output connectable to the MEMS transducer.

8. The integrated circuit of claim 3,
   wherein the test signal comprises a first test signal, and
   wherein the integrated circuit including a load resistor electrically connected to the test signal generator, wherein a second test signal is a thermo-acoustic signal produced by the load resistor in response to power applied by the test signal generator.

9. A transducer assembly comprising:
a housing including a sound port;
a micro-electromechanical system (MEMS) transducer disposed in the housing; and
an electrical circuit disposed in the housing, the electrical circuit electrically connected to an output of the MEMS transducer, the electrical circuit including a signal generator configured to generate and apply a test signal to the MEMS transducer,
wherein the test signal induces a response from the transducer assembly indicative of health of the transducer assembly,
wherein the electrical circuit includes:
an amplifier configured to receive an output signal from the MEMS transducer and generate an amplified signal having an output voltage;
a test load disposed between the MEMS transducer and the amplifier; and
a switching device configured to connect the test load with the MEMS transducer and the amplifier in a closed state and disconnect the test load from the MEMS transducer and the amplifier in an open state, and
wherein a fault is isolated by monitoring the response of the MEMS transducer when the test load is connected and disconnected.

10. The transducer assembly of claim 9, wherein the signal generator is configured to generate and apply the test signal as an impulse signal adapted to induce an impulse acoustic response from the transducer assembly.

11. The transducer assembly of claim 9, wherein the test signal is an electrical test signal that has a known characteristic and is applied to an electrical input of the transducer.

12. The transducer assembly of claim 9,
wherein the MEMS transducer includes a back plate and a diaphragm,
wherein the electrical circuit includes a bias circuit having a bias output coupled to a bias input of the MEMS transducer, and
wherein the test signal has a frequency within a bandwidth of the transducer assembly.

13. The transducer assembly of claim 9, wherein the test signal is a single frequency AC signal.

14. The transducer assembly of claim 9, wherein different test signals are applied to the MEMS transducer.

15. The transducer assembly of claim 14, wherein the different test signals comprise AC signals having different frequencies.

16. The integrated circuit of claim 3, wherein the test signal is swept across various frequencies to identify frequency locations that indicate at least one fault.

17. The integrated circuit of claim 3, wherein the evaluation circuit compares the response of the transducer assembly by comparing a frequency location of an amplitude peak to reference information to determine a deviation of the frequency location.

* * * * *